(12) United States Patent
Kajita

(10) Patent No.: US 8,531,190 B2
(45) Date of Patent: Sep. 10, 2013

(54) POWER SUPPLY NOISE MEASURING CIRCUIT AND POWER SUPPLY NOISE MEASURING METHOD

(75) Inventor: Mikihiro Kajita, Tokyo (JP)

(73) Assignee: NEC Corporation, Tokyo (JP)

( * ) Notice: Subject to any disclaimer, the term of this patent is extended or adjusted under 35 U.S.C. 154(b) by 557 days.

(21) Appl. No.: 12/797,943

(22) Filed: Jun. 10, 2010

(65) Prior Publication Data
US 2011/0025346 A1 Feb. 3, 2011

(30) Foreign Application Priority Data
Jul. 31, 2009 (JP) ................................ 2009-178959

(51) Int. Cl.
G01R 29/26 (2006.01)
(52) U.S. Cl.
USPC ........... 324/613; 324/108; 324/131; 324/522; 324/750.3; 702/57; 702/111; 702/190; 702/191
(58) Field of Classification Search
USPC ......................................................... 324/613
See application file for complete search history.

(56) References Cited

U.S. PATENT DOCUMENTS

| | | | |
|---|---|---|---|
| 6,211,746 B1 * | 4/2001 | Segawa et al. ................. | 331/143 |
| 7,102,332 B1 * | 9/2006 | Sasaki et al. ................... | 322/28 |
| 7,688,098 B2 * | 3/2010 | Kajita ......................... | 324/750.3 |
| 2005/0212528 A1 * | 9/2005 | Kajita ........................... | 324/613 |
| 2006/0186946 A1 * | 8/2006 | Hughes ......................... | 327/427 |
| 2006/0190878 A1 * | 8/2006 | Vazquez et al. .................. | 716/6 |
| 2009/0128134 A1 * | 5/2009 | Takamiya et al. .......... | 324/158.1 |
| 2011/0043220 A1 * | 2/2011 | Leibowitz et al. ............ | 324/613 |
| 2011/0190641 A1 * | 8/2011 | Tateishi et al. ................ | 600/479 |

FOREIGN PATENT DOCUMENTS

| | | |
|---|---|---|
| JP | 57-49866 A | 3/1982 |
| JP | 4-506565 A | 11/1992 |
| JP | 5-175848 A | 7/1993 |
| JP | 2005249408 A | 9/2005 |
| JP | 2009-194459 A | 8/2009 |
| WO | 2009/016742 A1 | 2/2009 |
| WO | 2009/084352 A1 | 7/2009 |

OTHER PUBLICATIONS

Dong-Young Chang et al., "A 0.9V 9mW 1MSPS Digitally Calibrated ADC With 75dB SFDR" 2003 Symposium on VLSI Circuits Digest of Technical Papers, 4-89114-035-6/03, 2003, pp. 1-4.
M. Takamiya et al., "An On-chip 100GHz-Sampling Rate 8-channel sampling Oscilloscope with Embedded Sampling Clock Generator", 2002 IEEE International Solid-State Circuits Conference, Session 11 / TD: RF/High-speed Technologies / Nov. 2, 2002.
Japanese Office Action for JP 2009-178959 mailed on Jun. 4, 2013 with English Translation.

* cited by examiner

*Primary Examiner* — Arleen M Vazquez
*Assistant Examiner* — Thang Le

(57) ABSTRACT

A power-supply noise measuring circuit includes a voltage fluctuation detecting circuit, a unit time generating circuit, a current measuring circuit, and a sampling circuit. The voltage fluctuation detecting circuit generates a detection current in accordance with a voltage fluctuation of a power supply. The unit time generating circuit generates a unit time in accordance with a clock signal. The current measuring circuit treasures an amount of the detection current per unit time. The sampling circuit samples the amount of the detection current measured by the current measuring circuit, every unit time. The present invention provides the power-supply noise measuring circuit that has a small circuit area and enough accuracy.

8 Claims, 10 Drawing Sheets

POWER SUPPLY NOISE MEASURING CIRCUIT AND POWER SUPPLY NOISE MEASURING METHOD

INCORPORATION BY REFERENCE

This application is based upon and claims the benefit of priority from Japanese patent application No. 2009-178959, filed on Jul. 31, 2009, the disclosure of which is incorporated herein in its entirety by reference.

BACKGROUND OF THE INVENTION

1. Technical Field

The present invention relates to a power-supply noise measuring circuit and a power-supply noise measuring method.

2. Background Art

In recent years, as the operation speed of a large-scale integration (LSI) circuit increases and the power consumption of the LSI circuit decreases, power-supply noise is undesirably generated due to power-supply voltage fluctuation, for example. The power-supply noise has a great influence on a delay design of the LSI circuit. As the power-supply noise increases, a delay variation increases, with the result that it is necessary to widen a margin for a timing design.

The margin widened by as much as the delay variation relative to a timing window that is reduced following acceleration of signal transmission within the LSI greatly influences realization of the signal transmission. It is, therefore important how accurately the amount of power-supply noise can be grasped.

It is necessary to measure the power-supply noise at any time in years to come. Therefore, a power-supply noise measuring circuit that is small enough to be mounted on any LSI circuit and has enough accuracy is needed.

Japanese Unexamined Patent Application Publication No. 2005-249408 discloses a power-supply noise measuring circuit. In this technique, as shown in FIG. 8, power-supply noise is measured by comparing the power-supply noise with a reference voltage using a comparator circuit 106.

In addition, as shown in FIG. 9, Intel Corporation discloses a power-supply noise measuring circuit in Publication "2003 Symposium on VLSI Circuits Digest of Technical Papers, 4-89114-035-6/03, FIG. 5". In this technique, power-supply noise is measured by extracting a minute change of a reference power-supply and a measuring power-supply, and by comparing the power-supply noise with a reference voltage.

As another example, as shown in FIG. 10, a power-supply noise measuring method using a sampling oscilloscope circuit is disclosed in Publication "ISSCC 2002/Feb. 5, 2002/Salon 10~15/9:00 AM, FIG. 11.2.1". In this technique, data is acquired at a data sampling timing that is shifted by one clock period with respect to a periodically-varying signal using, principles of the sampling oscilloscope. Therefore, the data acquiring period is increased T/ΔT times (T is one clock period, ΔT is resolution performance of data acquisition), and the data is retrieved as a low speed output.

However, in any of the techniques described above, it is necessary to mount a large amount of decoupling capacitors so as to prevent a measuring circuit itself from being affected by the power-supply noise. It is also necessary to mount a filter circuit in the power supply to perform denoising.

This causes a problem that the circuit area increases. Further, when the power-supply noise measuring circuit is mounted in the LSI circuit, an area I'm mounting the power-supply noise measuring circuit needs to be prepared in advance. However, an increase in the area where the power-supply noise measuring circuit is mounted greatly influences a floorplan.

Moreover, it is preferable, to dispose the power-supply noise measuring circuit near a logic circuit with high availability ratio. However, the increases in the area where the power-supply noise measuring circuit is mounted causes a problem that the power-supply noise measuring circuit is not always arranged at a desired area.

SUMMARY

In view of the above circumstances, the present invention has an object to provide a power-supply noise measuring circuit that has a small circuit area and enough accuracy.

A first exemplary aspect of the present invention is a power-supply noise measuring circuit including: a voltage fluctuation detecting circuit that generates a detection current in accordance with a voltage fluctuation of a power supply; a unit time generating circuit that generates a unit time in accordance with a clock signal; a current measuring circuit that measures an amount of the detection current per the unit time; and a sampling circuit that samples the amount of the detection current measured by the current measuring circuit per the unit time.

A second exemplary aspect of the present invention is a power-supply noise measuring method including; generating a detection current in accordance with a voltage fluctuation of a power-supply; generating a unit time in accordance with a clock signal; measuring an amount of the detection current per the unit time and sampling the measured amount of the detection current per the unit time.

The above and other objects, features and advantages of the present invention will become more fully understood from the detailed description given hereinbelow and the accompanying drawings which are given by way of illustration only, and thus are not to be considered as limiting the present invention.

EXEMPLARY EMBODIMENT

Exemplary embodiments of the present invention will be described below with reference to the accompanying drawings.

[First Exemplary Embodiment]

Figure 1:
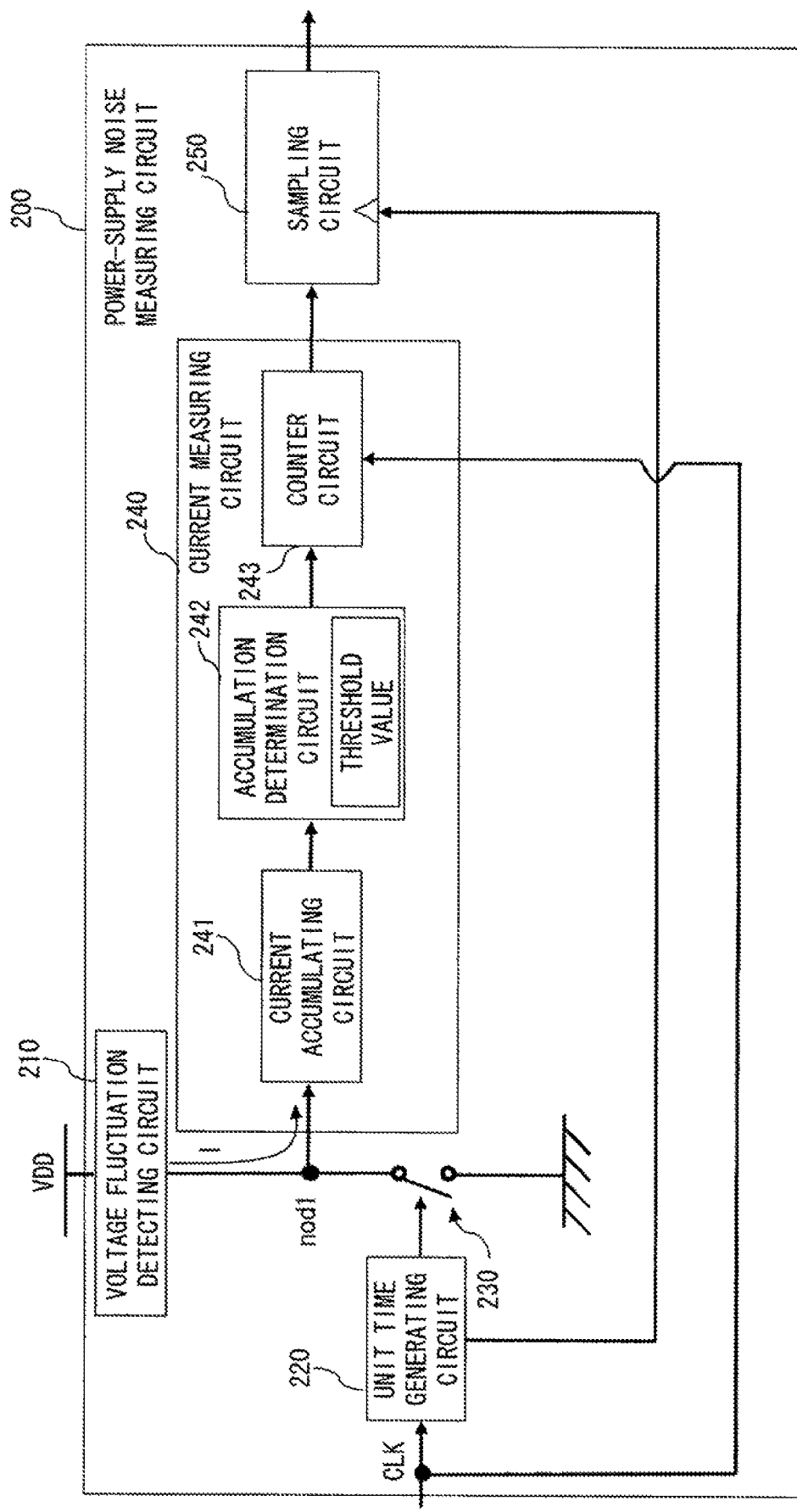
FIG. 1 is a block diagram showing a power-supply noise measuring circuit according to a first exemplary embodiment of the present invention.

A power-supply noise measuring circuit according to a first exemplary embodiment of the present invention will be described below, FIG. 1 is a block diagram showing the power-supply noise measuring circuit according to the first exemplary embodiment of the present invention.

A power-supply noise measuring circuit 200 includes a voltage fluctuation detecting circuit 210, a unit time generating circuit 220, a switching means 230, a current measuring circuit 240, and a sampling circuit 250.

The voltage fluctuation detecting circuit 210 is connected to a power supply VDD. Note that the power supply VDD supplies a plurality of semiconductor devices configuring an LSI circuit with a power supply for operation. Therefore, switching operations of the semiconductor devices cause power-supply noise of the power supply VDD. When the voltage of the power supply VDD is changed, the voltage fluctuation detecting, circuit 210 outputs a detection current which changes in accordance with the voltage fluctuation of the power supply VDD.

Figure 2:
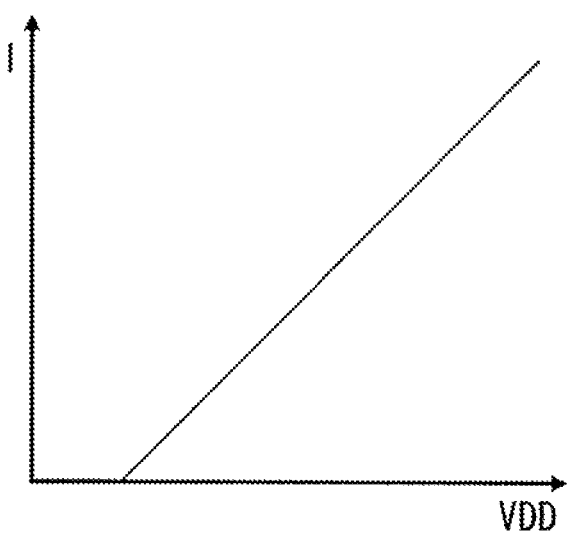
FIG. 2 is a graph illustrating the relationship between a detection current and a power-supply voltage.

The detection current, as shown in FIG. 2 for example, may be proportional to the change of the power supply VDD.

The unit time generating circuit 220 measures a predetermined unit time in accordance with a clock signal. The unit time generating circuit 720 may be a counter circuit that counts the number of pulses of the clock signal, or a frequency divider that divides the clock signal.

The unit time generating circuit 220 measures the unit time. When one unit time starts, the unit time generating circuit 220 makes the switching means 230 open. When one unit time terminates, the unit time generating circuit 220 makes the switching means 230 close.

Further, the unit time generating circuit 220 supplies the sampling circuit 250 with a set signal when one unit time terminates.

The switching means 230 is connected between the voltage fluctuation detecting circuit 210 and a ground potential and switched every unit time. A node nod1 that is connected with the voltage fluctuation detecting circuit 210 and the switching means 230 is connected to the current measuring circuit 240.

The current measuring circuit 240 measures the amount of the detection current every unit time. The current measuring circuit 240 includes a current accumulating circuit 241, an accumulation determination circuit 242, and a counter circuit 243.

The current accumulating circuit 241 includes, for example, a capacitor and accumulates the detection current. Specifically, when the switching means 230 is opened, a detection current I flows in the current accumulating circuit 241 and is accumulated at the current accumulating circuit 241 (refer to FIG. 1).

Figure 3:
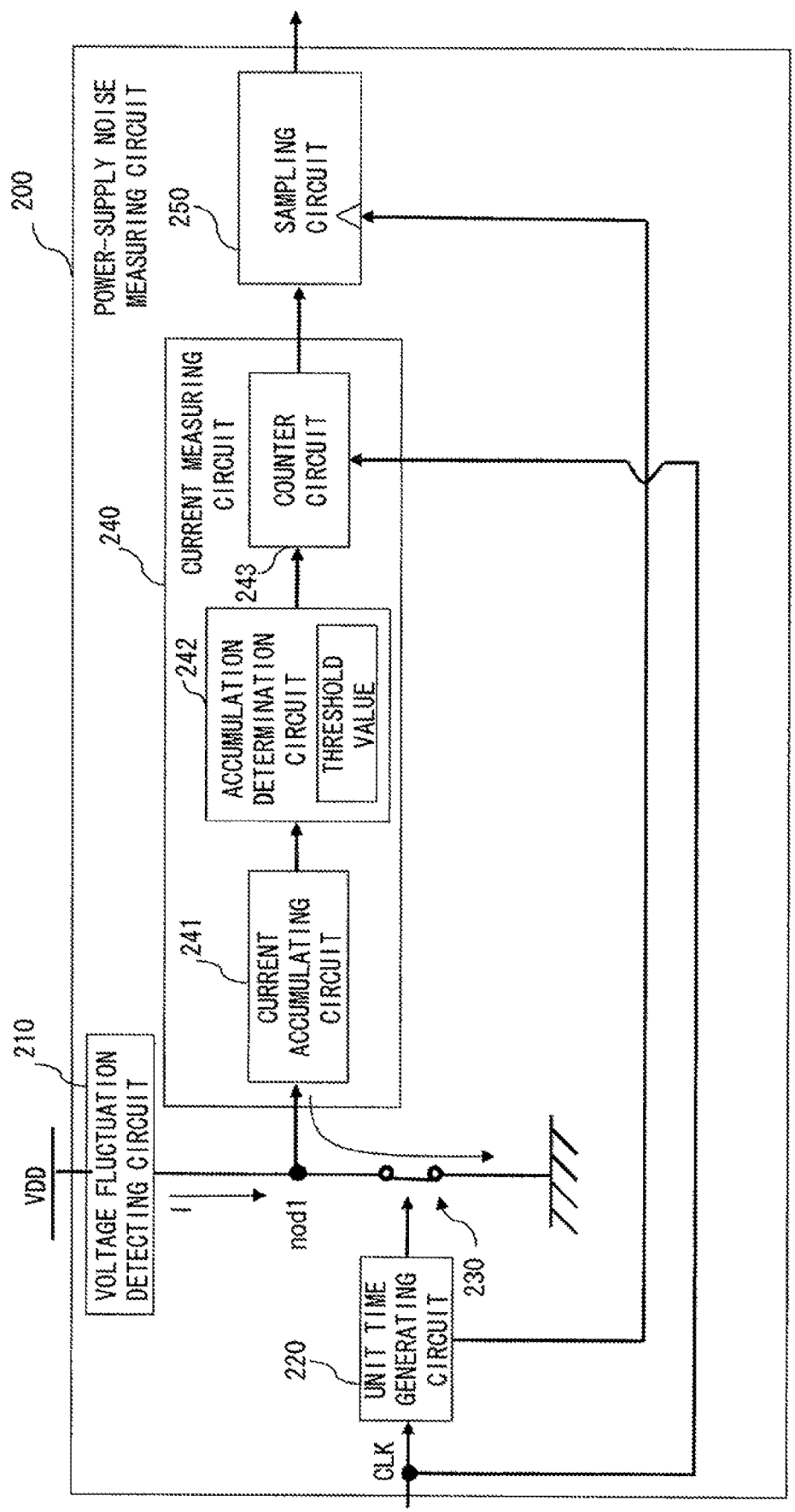
FIG. 3 is a block diagram illustrating operation of the power-supply noise measuring circuit when a switching means is closed.

On the other hand, as shown in FIG. 3, when the switching means 230 is closed, the detection current I flows to the ground potential through the switching means 230. Therefore, the detection current I is not accumulated at the current accumulating circuit 241.

Further, when the switching means 230 is closed, the charge accumulated at the current accumulating circuit 241 flows to the ground potential through the switching: means 230. Therefore, the charge accumulation of the current accumulating circuit 241 is reset.

The accumulation determination circuit 242 has a predetermined threshold voltage. The accumulation determination circuit 242 compares a voltage generated by the charge accumulated at the current accumulating circuit 241 with the threshold voltage. When the voltage generated by the charge accumulated at the current accumulating circuit 241 exceeds the predetermined threshold voltage, the accumulation determination circuit 242 outputs a determination signal.

The clock signal is supplied to the counter circuit 243. The counter circuit 243 counts the number of pulses of the clock signal.

The counter circuit 243 starts to count the number of the pulses of the clock signal upon receiving the determination signal from the accumulation determination circuit 242. If the determination signal becomes low level, the counter circuit 243 resets the number of the pulses (i.e. the number of the pulses is set to 0). If the determination signal becomes high level, the counter circuit 243 counts up the number of the pulses from 0.

The sampling circuit 250 samples the number of the pulses counted at the counter circuit 243.

The set signal output from the unit time generating circuit 220 is supplied to the sampling circuit 250. When the sampling circuit 250 receives the set signal, the sampling circuit 250 imports the count value of the counter circuit 243.

Because the unit time generating circuit 220 outputs the set signal when one unit time terminates, the sampling circuit 250 imports the count value of the counter circuit 243 every unit time.

Next, the operation of the power-supply noise measuring circuit according to the first exemplary embodiment is described below.

The clock signal is supplied to the unit time generating circuit 220. The unit time generating circuit 220 measures the unit time. When the unit time starts, the switching means 230 is opened.

If the voltage of the power supply fluctuates due to the occurrence of power-supply noise, the detection current is output from the voltage fluctuation detecting circuit 210 in accordance with the voltage fluctuation of the power supply. The detection current is accumulated at the current accumulating circuit 241.

The charge is accumulated at the current accumulating circuit 241. If the voltage generated by the charge accumulated at the current accumulating circuit 241 exceeds the predetermined threshold voltage, the accumulation determination circuit 242 outputs the determination signal.

The counter circuit 243 starts to count the number of the pulses of the clock signal upon receiving the determination signal.

When one unit time terminates, the set signal output from the unit time generating circuit 220 is supplied to the sampling circuit 250. When the sampling circuit 250 receives the set signal, the sampling circuit 250 imports the count value of the counter circuit 243.

Further, when one unit time terminates, the unit time generating circuit 220 makes the switching means 230 close. Then, the detection current flows to the ground potential through the switching means 230, and the charge accumulated at the current accumulating circuit 241 also flows to the ground potential.

Thus, the current measuring circuit 240 is reset.

Figure 4:
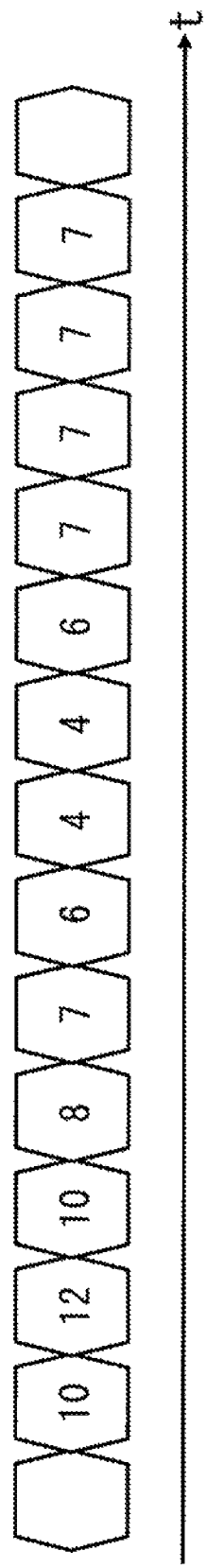
FIG. 4 is an exemplary diagram showing data acquired by a sampling circuit.

FIG. 4 is an exemplary diagram showing data acquired by the sampling circuit 250. The data is arranged after the operation described above is continued every unit time.

The numerical values shown in FIG. 4 each indicate the lapse of time after the current accumulating value exceeds the predetermined threshold voltage in each unit time.

The numerical values shown in FIG. 4 correlate with the amount of the power-supply noise.

For example, when the power-supply noise is generated so that the voltage of the power supply becomes higher than the predetermined value in a given unit time, the detection current increases and the charge is accumulated faster at the current accumulating circuit 241.

If the charge is accumulated faster, the counter circuit 243 starts counting earlier, and thus the count value (i.e. the numerical values shown in FIG. 4) becomes high.

On the other hand, when the power-supply noise is generated so that the voltage of the power supply becomes lower than the predetermined value, the detection current decreases and the charge is accumulated slower at the current accumulating circuit 241.

If the charge is accumulated slower, the counter circuit 243 starts counting with a delay, and thus the count value (i.e. the numerical values shown in FIG. 4) becomes low.

Thus, it is possible to measure the power-supply noise by acquiring, the count values every unit time.

Note that the count values acquired as described above, for example, may be stored at a memory circuit such as SRAM mounted in or out of the LSI circuit. The count values may be read out and analyzed as needed.

The analysis result is beneficial information for subsequent circuit design.

Figure 5:
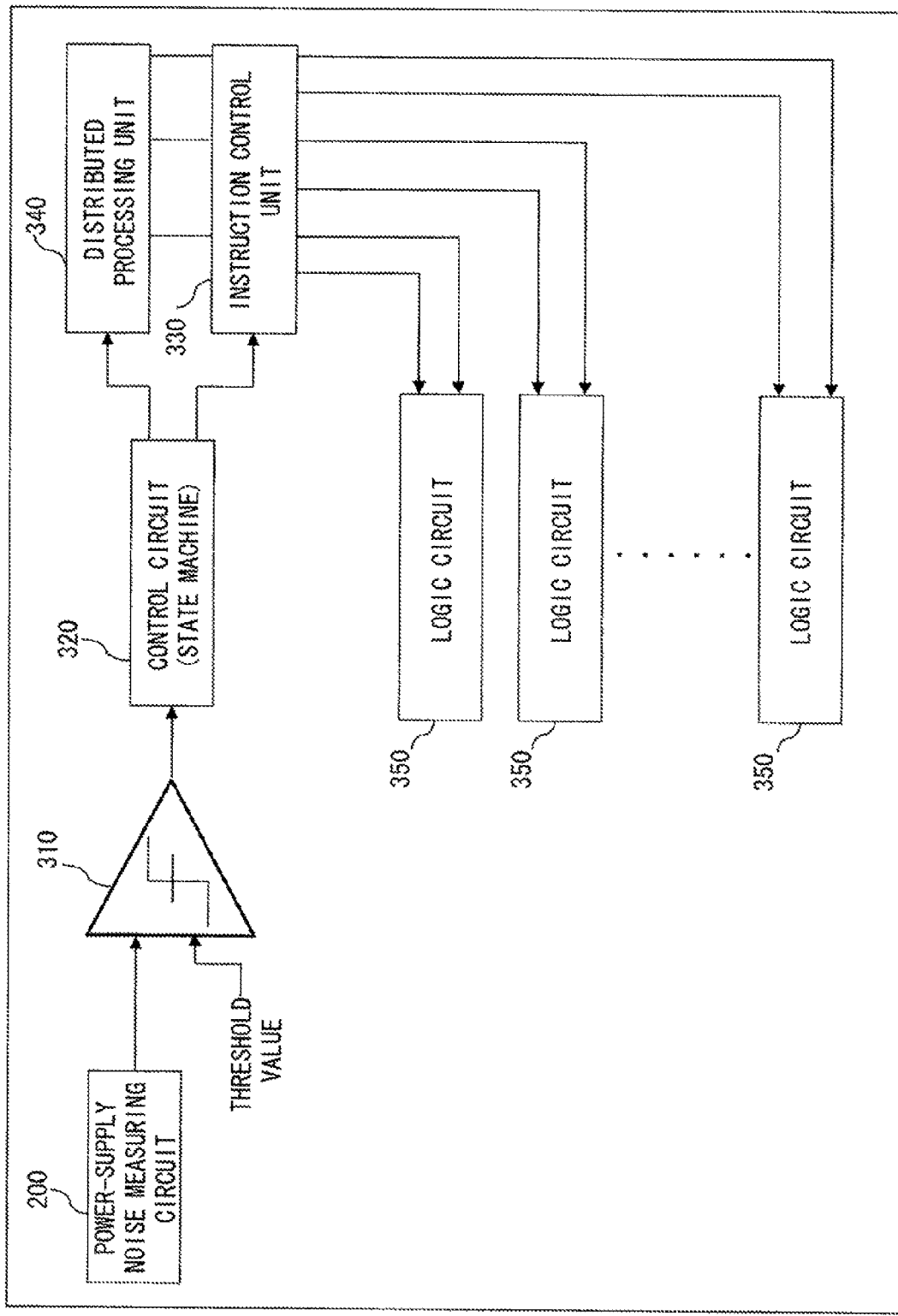
FIG. 5 is an exemplary block diagram showing an application using a measured result of the power-supply noise measuring circuit.

Further, as shown in FIG. 5, instructions for each logic circuit 350 may be temporarily slowed down or distributed processing may be performed in accordance with the measured result obtained by the power-supply noise measuring circuit 200.

That is as shown in FIG. 5, the measured result obtained by the power-supply noise measuring circuit 200 is supplied to one input terminal, of a comparator circuit 310. A predetermined threshold value is supplied to the other input terminal of the comparator circuit 310. When the count value corresponding to the power-supply noise exceeds the predetermined threshold value, the comparator circuit 310 supplies a control circuit (state machine) 320 with a comparison result.

Then, the control circuit 320 changes a control status in accordance with the comparison result of the comparator circuit 310. For example, if the power-supply noise is at a high level, the instructions from an instruction control unit 330 are slowed down, or the distributed processing is performed at a distributed processing unit 340.

Thus, it is possible to prevent malfunction by changing operation speed of the circuit in accordance with increase and decrease of the power-supply noise.

The power-supply noise measuring circuit 200 according to the first exemplary embodiment described above makes it possible to provide advantageous effects described below.

In the power-supply noise measuring circuit 200 according to the first exemplary embodiment, the voltage fluctuation detecting circuit 210 which detects the power-supply noise is configured to detect the voltage fluctuation of the power-supply itself.

Because the other circuits can be configured by digital circuits, the logical operation is less influenced in spite of the influence of the voltage fluctuation. That is, the circuit configuration according to the first exemplary embodiment is insusceptible to the power-supply noise. Therefore, large decoupling capacitors or filters as employed in the related art are not needed for the power-supply noise measuring circuit according to the first exemplary embodiment.

As a result, it is possible to reduce the circuit area of the power-supply noise measuring circuit 200 according to the first exemplary embodiment.

Reduction in the circuit area results in no restriction on the layout of the power-supply noise measuring circuit.

This makes it possible to arrange the power-supply noise measuring circuit as desired. For example, the power-supply noise measuring, circuit can be arranged at the area where the noise during operation is supposed to be high.

[Second Exemplary Embodiment]

A power-supply noise measuring circuit according to a second exemplary embodiment of the present invention will be described below.

The basic configuration of the power-supply noise measuring circuit according to the second exemplary embodiment is the same as that of the first exemplary embodiment. The power-supply noise measuring circuit according to the second exemplary embodiment has a more specific configuration.

Figure 6:
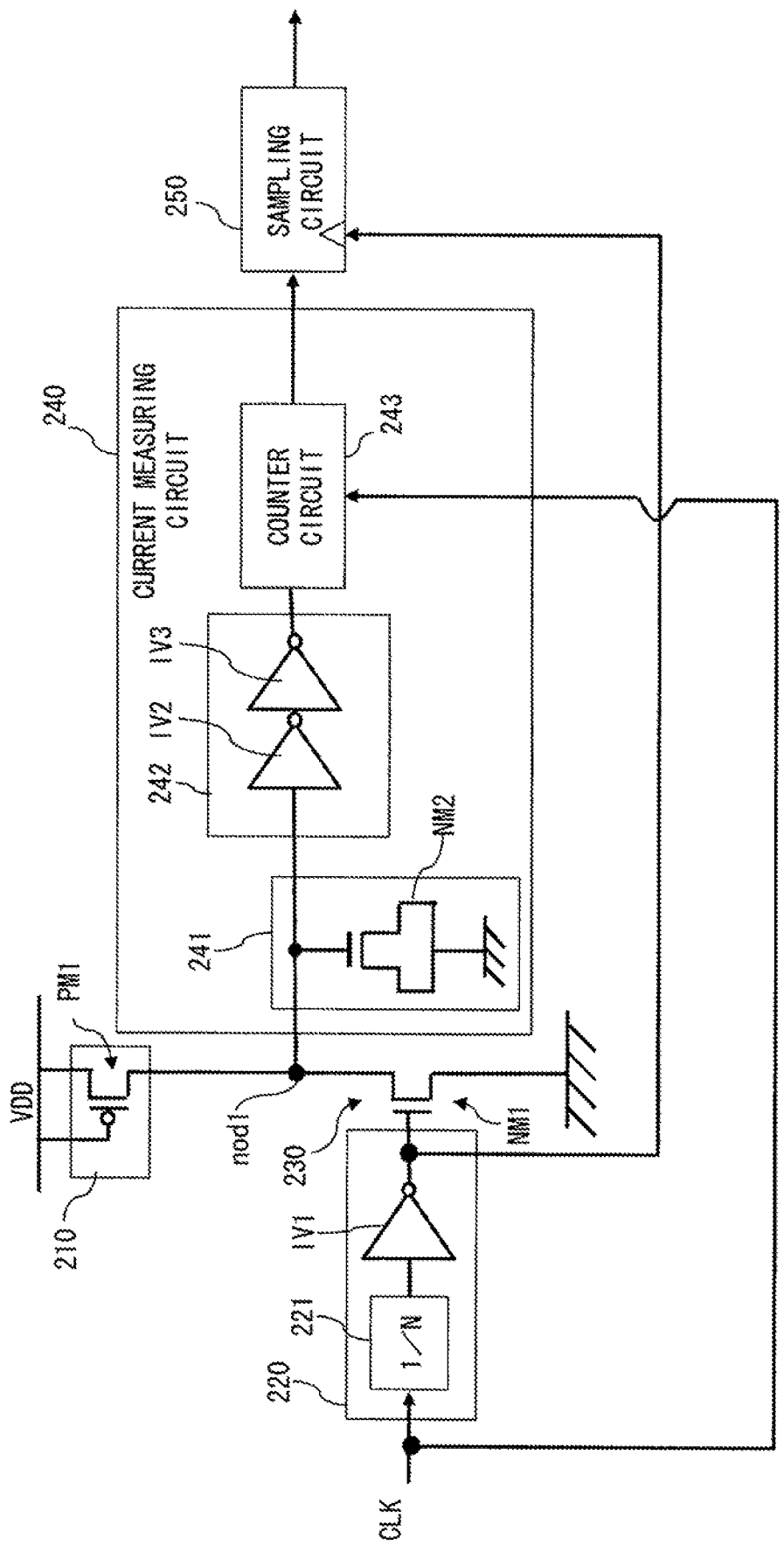
FIG. 6 is a block, diagram showing a power-supply noise measuring circuit according to a second exemplary embodiment of the present invention.

FIG. 6 is a block diagram showing the power-supply noise measuring circuit according to the second exemplary embodiment of the present invention.

The voltage fluctuation detecting circuit 210 includes a p-type MOS transistor PM1 having a gate and a source connected to the power supply in the second exemplary embodiment.

A leak current flows from the p-type MOS transistor PM1 in accordance with the voltage fluctuation of the power supply. The leak current serves as the detection current.

The unit time generating circuit 220 includes a frequency divider 221 and an inverter circuit IV1. The frequency divider 221 divides the clock signal. The inverter circuit IV1 inverts the output signal of the frequency divider 221.

The output of the inverter circuit IV1 is supplied to the switching means 230 and the sampling circuit 250.

The switching means 230 includes an n-type MOS transistor NM1. The output of the inverter circuit IV1 is supplied to a gate of the n-type MOS transistor NM1.

The current accumulating circuit 241 includes an n-type well capacitor that is formed by an n-type MOS transistor NM2. Specifically, a source and a drain of the n-type MOS transistor NM2 are connected to each other. The connecting point therebetween is connected to the ground potential (lower potential). Further, a gate of the n-type MOS transistor NM2 is connected to the node nod1.

The accumulation determination circuit 242 includes two inverter circuits IV2 and IV3 connected in series. A logical, threshold value of the inverter circuit IV2 is equivalent to the threshold voltage mentioned above.

In this configuration, the leak current varies in accordance with the value of the power supply VDD, as shown in FIG. 2.

The leak current is accumulated at the n-type well capacitor NM1. However, when the switching transistor NM1 is on the leak current flows to the ground potential GND. Therefore, the charge is not accumulated at the n-type well capacitor NM2.

On the other hand, when the switching transistor NM1 is off, the charge is accumulated at the n-type well capacitor NM2.

At the timing when the charge is accumulated enough at the n-type well capacitor NM2 and the voltage generated by the charge exceeds the logical threshold value of the inverter circuit IV2 that is connected next to the n-type well capacitor NM2, the output of the inverter circuit IV2 is inverted, Then, the output of the inverter circuit IV3 that is connected next to the inverter circuit IV2 is inverted in the same manner. Finally, a high level signal is supplied to the input of the counter circuit 243.

When the input of the counter circuit 243 becomes high level, the counter circuit 243 starts and continues counting until the input of the counter circuit 243 becomes low level. That is, the counter circuit 243 stops counting at the timing when the switching transistor NM1 turns on.

A signal that is generated by dividing the clock signal by the frequency divider 221 is supplied to the switching transistor NM1 through the inverter circuit IV1.

If the divided clock signal output from the frequency divider 221 changes from low level to high level, the output of the inverter circuit IV1 changes from high level to low level. Then, the switching transistor NM1 turns off, and charging from the p-type MOS transistor PM1 (i.e. the leak current source) to the n-type well capacitor NM2 is started.

If the divided clock signal output from the frequency divider 221 changes from high level to low level, the output of the inverter circuit IV1 changes from low level to high level. Then, the switching transistor NM1 turns on.

At the same time, the high level signal output from the inverter circuit IV1 is supplied to the sampling circuit 250 as the set signal. Then, the count value of the counter circuit 243 is sampled by the sampling circuit 250 that is connected next to the counter circuit 243.

FIG. 4 shows the count value sampled by the sampling circuit 250. Thus, the count value according to the change of the power-supply noise is acquired.

Therefore, this makes it possible to measure the fluctuation of the power-supply noise The second exemplary embodiment with the configuration described above makes it possible to achieve the power-supply noise measuring circuit according to the first exemplary embodiment.

The voltage fluctuation detecting circuit 210, the switching means 230 and the current accumulating circuit 241 are configured by MOS transistors. This makes it possible to configure the power-supply noise measuring circuit with a small number of components and a small size.

Further, the logical threshold value of the inverter circuit IV2 in the accumulation determination circuit 242 is used as the threshold voltage. This makes it possible to reduce the circuit area compared to the circuit which has a comparator that needs an input of a reference value, for example.

Therefore, according to the second exemplary embodiment, it is possible to reduce the circuit area of the power-supply noise measuring circuit 200 and achieve enough accuracy of measurement.

[Third Exemplary Embodiment]

To achieve higher accuracy of measurement, it is preferable to measure the power-supply noise at the logical operation based on an initial value. The initial value is the count value at an initial test of the LSI circuit or at start-up of the circuit.

Figure 7:
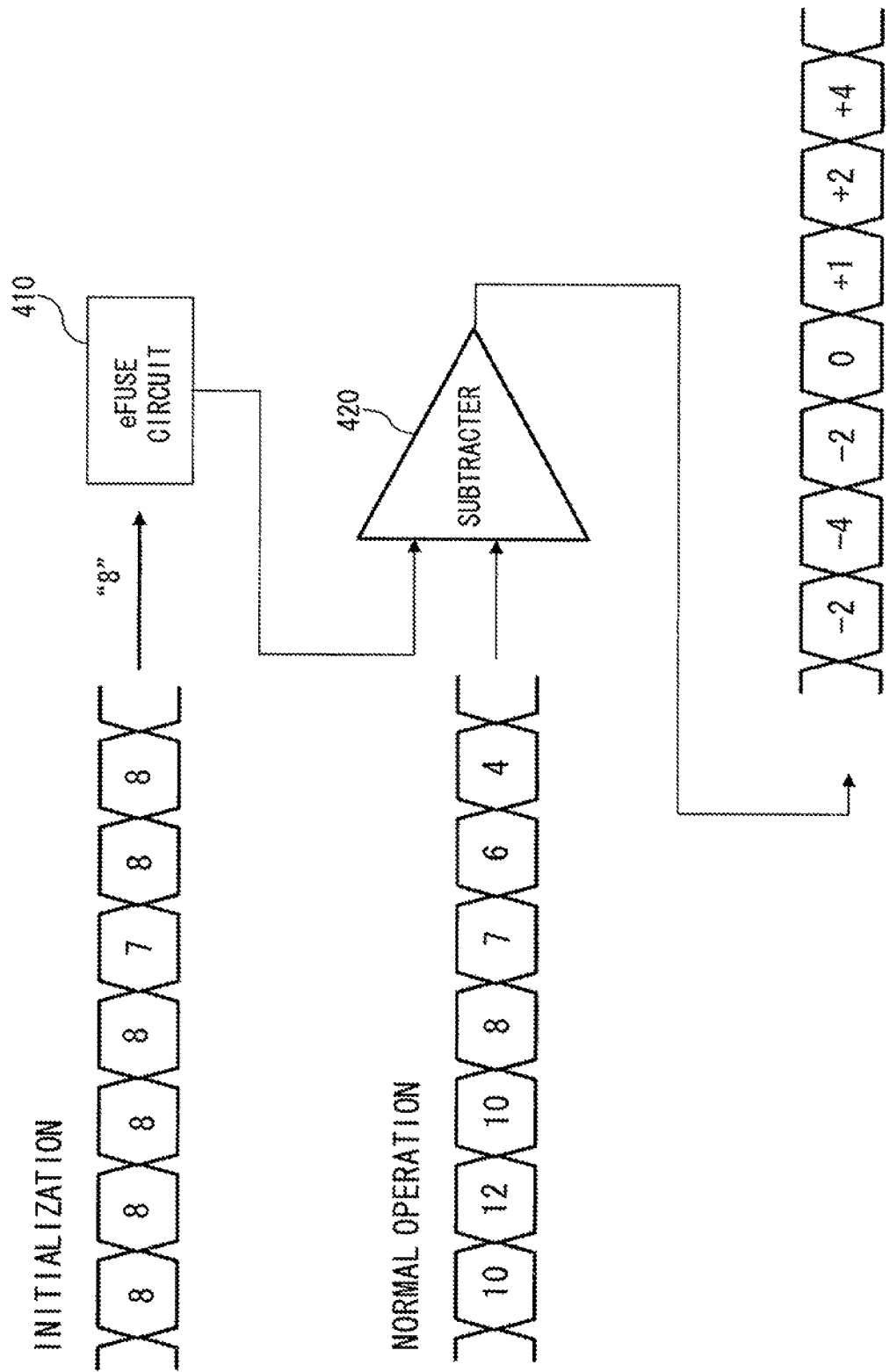
FIG. 7 is a diagram showing, a third exemplary embodiment of the present invention.
Figure 8:
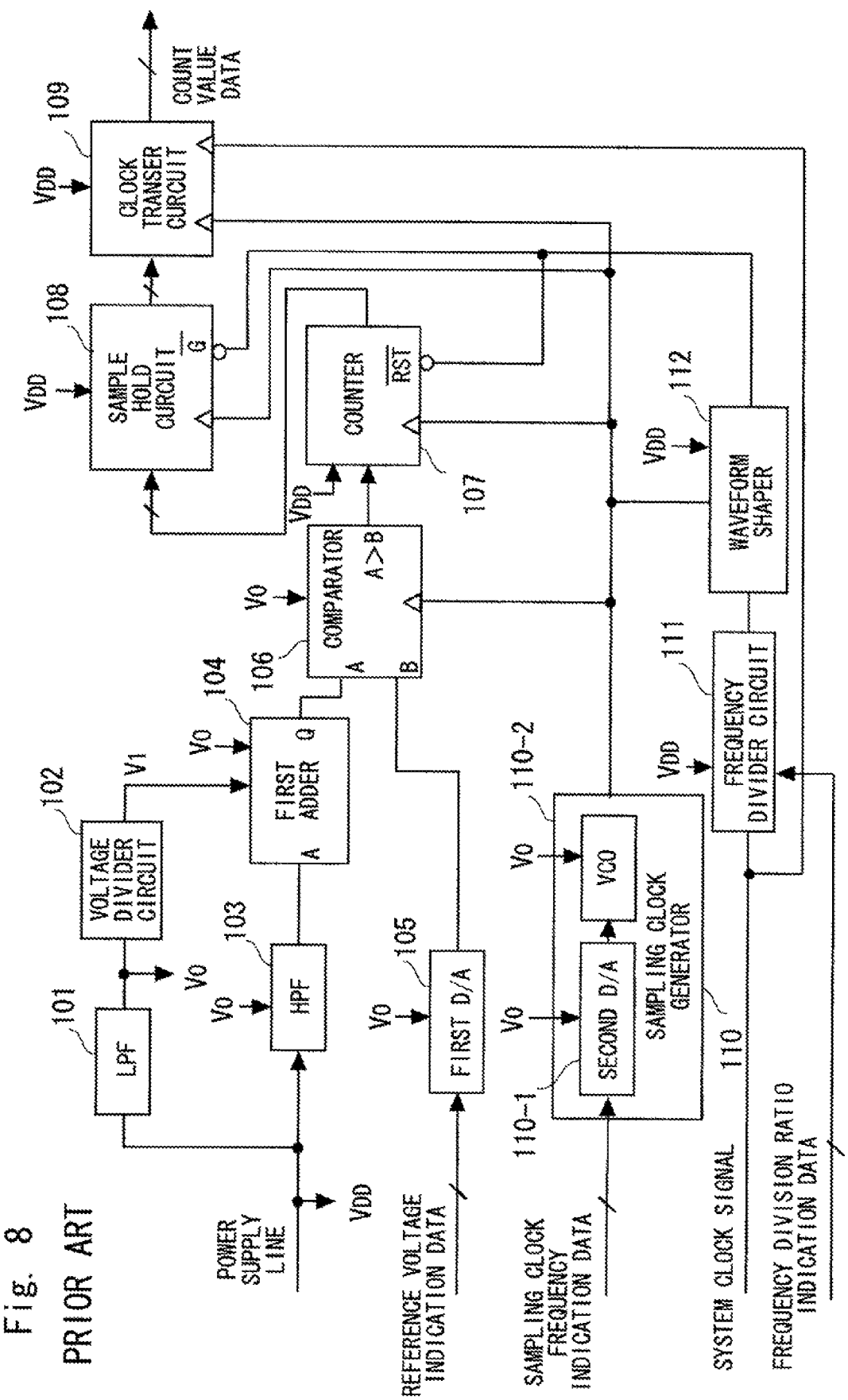
FIG. 8 is a block diagram showing a related art.
Figure 9:
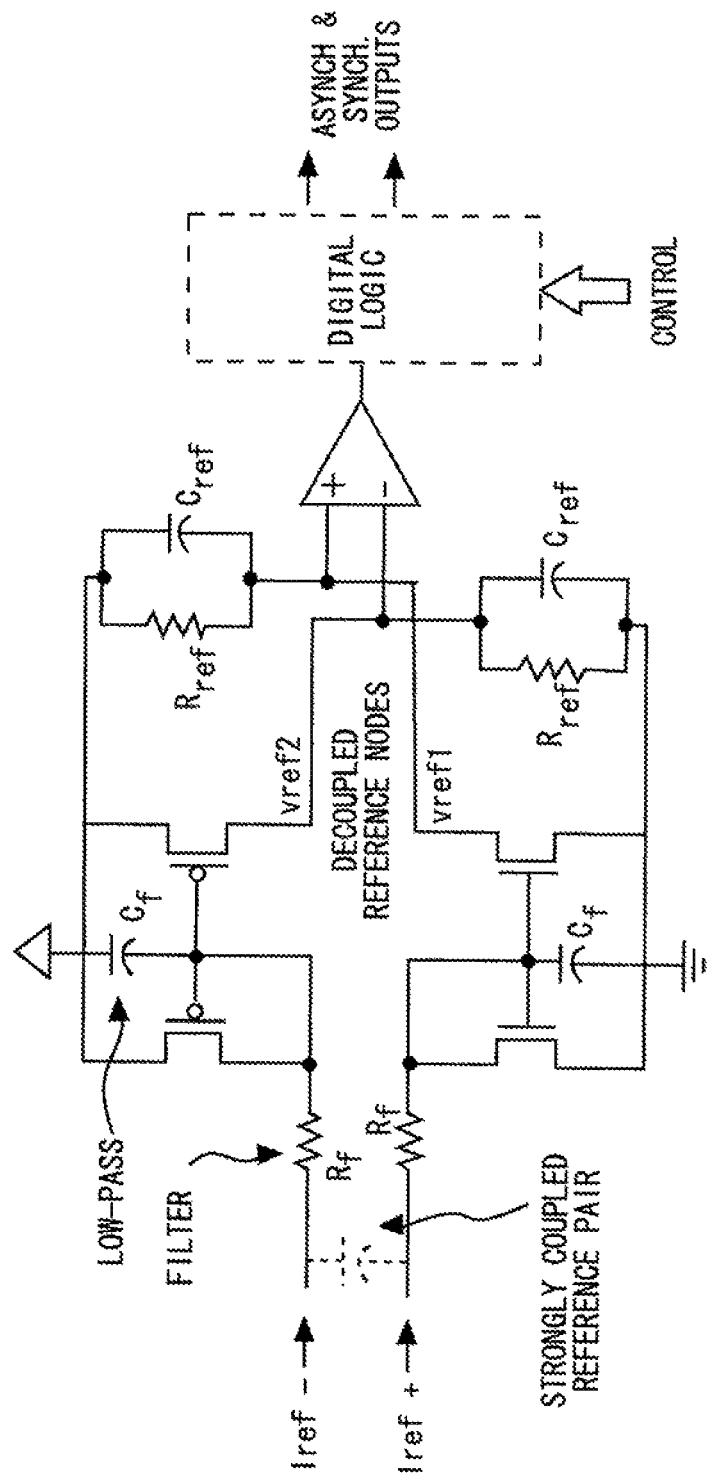
FIG. 9 is a block diagram showing another related art.
Figure 10:
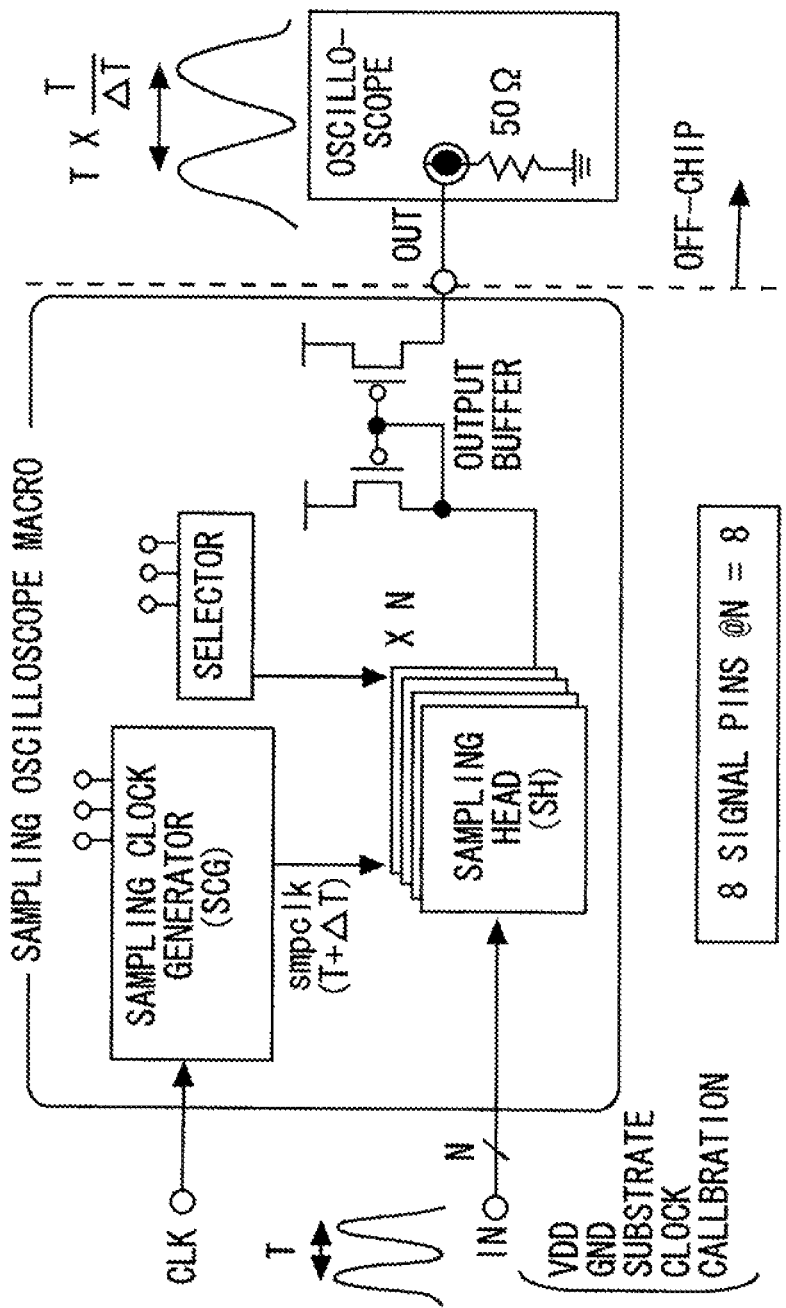
FIG. 10 is a block diagram showing still another related art.

For example, as shown in FIG. 7, an eFUSE circuit 410 is mounted in the LSI circuit as a storage for storing the initial value.

The eFUSE circuit 410 is the storage device which can be written only once. The initial value of the count value is read out and stored at the eFUSE circuit 410 at the initial test of the LSI circuit or at the start-up of the circuit (i.e. initialization sequence).

In an example shown in FIG. 7, the count value is around "8". Therefore, the value "8" is stored as the initial value at the eFUSE circuit 410.

The initial value is considered the count value that corresponds to net source voltage with no power-supply noise.

Note that the initial value to be acquired may be an average value, a mode value, or an intermediate value of the counter values acquired at the initial test of the LSI circuit or at the start-up of the circuit. The initial value which can be used as a representing value ma arbitrarily be selected.

After the initialization, the process shifts to the normal operation and the count value at the normal operation is acquired in the manner as mentioned in the first and second exemplary embodiments.

Further, the count value at the normal operation and the initial value are compared, and the difference therebetween is acquired. For example, the difference may be acquired by a subtracter 420.

Further, the specific value of the power-supply noise, that is, the value of the voltage fluctuation itself can be measured by storing the difference between the count value at the normal operation and the initial value.

Note that the voltage fluctuation detecting circuit 210 is configured by the leak current source with the p-type MOS transistor as an example in the exemplary embodiments described above. However, the voltage fluctuation detecting circuit 210 may be configured by a resistor with high resistivity.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims

What is claimed is:

1. A power-supply noise measuring circuit comprising:
   a voltage fluctuation detecting circuit that generates a detection current in accordance with a voltage fluctuation of a power supply;
   a unit time generating circuit that generates a unit time in accordance with a clock signal;
   a current measuring circuit that measures an amount of the detection current per the unit time; and
   a sampling circuit that samples the amount of the detection current measured by the current measuring circuit per the unit time;
   wherein the current measuring circuit includes:
      a current accumulating circuit that accumulates the detection current;
      an accumulation determination circuit that determines that an amount of charge accumulated at the current accumulating circuit exceeds a predetermined threshold value, and outputs a determination signal; and
      a counter circuit that starts to count a number of pulses of the determination signal in response to the output of the determination signal.

2. The power-supply noise measuring circuit according to claim 1, wherein the unit time generating circuit includes a frequency divider that divides the clock signal and generates the unit time.

3. The power-supply noise measuring circuit according to claim 1, wherein the amount of the detection current is reset per the unit time.

4. The power-supply noise measuring circuit according to claim 3, further comprising a switching means that is connected between the current measuring circuit and a ground potential and switched per the unit time.

5. The power-supply noise measuring circuit according to claim 1, wherein the current accumulating circuit includes an n-type well capacitor that is formed by an n-type MOS transistor.

6. The power-supply noise measuring circuit according to claim 1, wherein the accumulation determination circuit includes an inverter circuit, and the predetermined threshold value is a logical threshold value of the inverter circuit.

7. The power-supply noise measuring circuit according to claim 1, wherein the voltage fluctuation detecting circuit includes a p-type MOS transistor having a source and a gate connected to the power supply, and the detection current is a leak current of the p-type MOS transistor.

8. A power-supply noise measuring circuit comprising:
- a voltage fluctuation detecting circuit that generates a detection current in accordance with a voltage fluctuation of a power supply;
- a unit time generating circuit that generates a unit time in accordance with a clock signal;
- a current measuring circuit that measures an amount of the detection current per the unit time;
- a sampling circuit that samples the amount of the detection current measured by the current measuring circuit per the unit time; and
- an initial value storing circuit that stores a sampling value sampled at an initialization sequence as an initial value,
- wherein a difference between the sampling value sampled at an normal operation and the initial value is obtained as an amount of power-supply noise.

* * * * *